United States Patent
Van De Ven et al.

(10) Patent No.: US 6,800,573 B2
(45) Date of Patent: Oct. 5, 2004

(54) WATER-VAPOR-PERMEABLE, WATERTIGHT, AND HEAT-REFLECTING FLAT COMPOSITE, PROCESS FOR ITS MANUFACTURE, AND USE THEREOF

(75) Inventors: Henricus J. M. Van De Ven, Arnhem (NL); Jozef C. W. Spijkers, Haan (DE); Karl W. Kopp, Reinheim (DE)

(73) Assignee: Sympatex Technologies GmbH, Wuppertal (DE)

( * ) Notice: Subject to any disclaimer, the term of this patent is extended or adjusted under 35 U.S.C. 154(b) by 107 days.

(21) Appl. No.: 09/943,148

(22) Filed: Aug. 31, 2001

(65) Prior Publication Data

US 2002/0049020 A1 Apr. 25, 2002

(30) Foreign Application Priority Data

Sep. 1, 2000 (DE) .......................................... 100 43 513

(51) Int. Cl.[7] .................................................. D04H 1/00
(52) U.S. Cl. ...................... 442/377; 442/76; 442/118; 442/394; 442/395; 442/304; 442/316; 442/319; 442/379; 427/245; 427/123; 427/124; 427/126.1
(58) Field of Search .................. 442/76, 118, 394, 442/395, 304, 316, 319, 377, 379; 427/245, 123, 124, 126.1

(56) References Cited

U.S. PATENT DOCUMENTS

| 4,068,034 A | * | 1/1978 | Segawa et al. ............. 428/421 |
| 4,344,998 A | * | 8/1982 | de Leeuw et al. .......... 428/212 |
| 4,637,947 A | * | 1/1987 | Maekawa et al. ............. 428/68 |
| 4,783,243 A |   | 11/1988 | Ando et al. |
| 5,447,783 A | * | 9/1995 | Horn .......................... 428/216 |
| 5,458,955 A | * | 10/1995 | Vaughn et al. .............. 428/212 |
| 5,955,175 A |   | 9/1999 | Culler |
| 6,187,696 B1 | * | 2/2001 | Lim et al. ..................... 442/77 |

FOREIGN PATENT DOCUMENTS

| DE | 43 22 512  | 1/1994  |
| EP | 0 443 696  | 8/1991  |
| JP | 55-104947  | 8/1980  |
| JP | 62-94334   | 4/1987  |
| JP | 62-282078  | 12/1987 |
| JP | 11-279306  | 10/1999 |

* cited by examiner

*Primary Examiner*—Elizabeth M. Cole
*Assistant Examiner*—Norca L. Torres
(74) *Attorney, Agent, or Firm*—Oliff & Berridge, PLC

(57) ABSTRACT

A water-vapor-permeable, watertight, heat-reflecting flat composite is made by a process of combining a metal layer and a nonporous, water-vapor-permeable, watertight, hydrophilic flat substrate. The process includes at least the three steps of (1) selecting the substrate, (2) pre-cleaning the substrate, and (3) applying the substrate to the metal layer. Such a composite offers protection from heat loss, infrared-based detection, ultraviolet radiation, electro-smog, and static electricity.

15 Claims, No Drawings

WATER-VAPOR-PERMEABLE, WATERTIGHT, AND HEAT-REFLECTING FLAT COMPOSITE, PROCESS FOR ITS MANUFACTURE, AND USE THEREOF

BACKGROUND OF THE INVENTION

1. Field of Invention

The present invention relates to a water-vapor-permeable, watertight, and heat-reflecting flat composite, a process for its manufacture, and use thereof.

2. Description of Related Art

Water-vapor-permeable, watertight, and heat-reflecting composites made from a metal layer and a microporous membrane are known in the art. U.S. Pat. No. 5,955,175 describes a textile material produced by metallizing a microporous membrane. The metallization causes a reflection of thermal radiation. The metal forms a discontinuous layer on the surface and on the pore walls of the microporous membrane that are adjacent to the surface. Compared to the size of $H_2O$ molecules, the pores of the microporous membrane are very large, even in the metallized state, so that the water-vapor permeability of the microporous membrane is maintained even after it is metallized.

Water-vapor-permeable, watertight, and heat-reflecting composites made from a metal layer and a nonporous membrane, or from a nonporous substrate, have not yet been disclosed. In attempting the metallization of a microporous membrane, as described in U.S. Pat. No. 5,955,175, with a nonporous membrane, it is observed that the adhesion between the metal layer and the nonporous membrane is very poor, i.e., that the metal layer peels off even after short use.

SUMMARY OF THE INVENTION

For this reason, it is an object of the present invention to provide a process for manufacturing a water-vapor-permeable, watertight, and heat-reflecting composite from a metal layer and a nonporous substrate, and to provide such a composite that at least reduces the aforementioned disadvantage.

These and other objects are achieved by a process for manufacturing a water-vapor-permeable, watertight, heat-reflecting flat composite comprising a metal layer and a nonporous, water-vapor-permeable, watertight, hydrophilic flat substrate, whereby the metal layer has a surface facing the substrate and a surface facing away from the substrate, and whereby the substrate has a surface facing the metal layer and a surface facing away from the metal layer, comprising at least the following steps:

a) selecting the substrate, b) pre-cleaning at least one surface of the substrate, and c) applying the metal layer to the substrate surface facing the metal layer.

The composites made by the process of the invention exhibit adhesion between the metal layer and substrate that passes the Tesa tape test.

DETAILED DESCRIPTION OF PREFERRED EMBODIMENTS

As previously noted, in the case of the known metallized microporous membrane, the pores of this membrane, which are very large compared to $H_2O$ molecules, ensure its water-vapor permeability. In the metallization of a nonporous water-vapor-permeable and watertight substrate, however, it was to be expected that a continuous metal layer that is no longer water-vapor-permeable is formed on the substrate. This applies all the more, since it is known from the field of packaging films that films can be provided with a thin metal layer that, as described in JP-A-11-279,306, already forms a vapor barrier at a thickness of about 10 nm.

For this reason, it must be considered surprising that, in the form of the process of the invention, a composite made from a metal layer and a nonporous substrate is rendered accessible that is not only heat-reflecting but is also water-vapor-permeable to a significant extent. It must be considered even more surprising that, with the process of the invention, composites can be provided that even under 100% heat reflection exhibit a water-vapor permeability that is only slightly reduced compared to a non-metallized, nonporous substrate.

In a preferred embodiment of the process of the invention, a polyether ester, polyether amide, or polyether urethane film is selected as a substrate in step a). The process of selecting the substrate may include steps for preparing the substrate.

In another preferred embodiment of the invention, the substrate selected in step a) is joined to a textile fabric, such as a woven, nonwoven, or knitted fabric, on the side facing away from the metal layer to be applied in step c).

In another preferred embodiment of the invention, the substrate selected in step a) is joined to a textile fabric, such as a woven, nonwoven, or knitted fabric, on the side facing the metal layer to be applied in step c), the filaments of which are spaced apart. Spacing of the filaments ensures that a portion of the substrate surface is accessible for steps b) and c).

In accordance with the invention, the substrate must be pre-cleaned in step b) prior to applying the metal layer in step c), whereby the pre-cleaning is preferably conducted on the side of the substrate that is to face the metal layer to be applied in step c).

To pre-clean the substrate, a plasma treatment in oxygen has proven suitable for the process of the invention in order to achieve good adhesion between the metal and substrate. For this reason, a plasma treatment is preferably employed in the process of the invention, whereby the plasma treatment is conducted in a vacuum, preferably at a pressure of about 1 mbar to about 0.001 mbar and more preferably at a pressure of about 0.01 mbar to about 0.03 mbar.

Furthermore, for the pre-cleaning of the substrate in the process of the invention, a plasma treatment in a gas containing oxygen is preferred, whereby it is especially preferred to use a mixture of about 10 to about 50% oxygen by volume and about 90 to about 10% nitrogen by volume as the gas containing oxygen. According to the invention, air is highly preferred as the gas containing oxygen, because the use of air results in good pre-cleaning of the substrate after only brief plasma treatment, such that the metal layer to be applied in step c) adheres to the substrate and passes the Tesa tape test.

In the context of the present invention, passing the Tesa tape test means that, when attempting to remove a strip of "Tesa" tape applied to the metal layer of the substrate, either the substrate is lacerated or the "Tesa" tape can be removed without destroying the substrate and without transferring metal with it.

In a preferred embodiment of the process of the invention, the plasma treatment is conducted in air, especially preferably at atmospheric pressure, i.e., as a corona discharge. The advantage of this embodiment is that generation of a vacuum is not required. However, foreign gases, which can be present in the air of the laboratory or production facility, can interfere with the pre-cleaning process.

For this reason, in another especially preferred embodiment of the process of the invention, the plasma treatment is conducted in a mixture of about 10% to about 50% oxygen by volume and about 90% to about 50% nitrogen by volume, or in air, in a vacuum. In this manner, the penetration of foreign gases into the plasma is prevented, thus ensuring that the plasma treatment indeed takes place only in a defined plasma gas.

Preferably, the vacuum is from about 1 mbar to about 0.001 mbar, and especially preferably from about 0.01 mbar to about 0.03 mbar, since a particularly brief pre-treatment is possible in these ranges.

The application of the metal layer in step c) of the process of the invention is preferably performed by physical vapor deposition (PVD). This is a known coating technique and is described in L. Holland, "Vacuum Deposition of Thin Films", Chapman and Hall, London (1966), for example.

In the process of the invention, the metal layer is preferably applied with a thickness of about 10 nm to about 200 nm, and especially preferably with a thickness of about 30 nm to about 180 nm.

For applying the metal layer in the process of the invention, basically any metal can be used that can be applied using PVD. In the process of the invention, the metal layer applied is preferably Al, Cu, Au, or Ag, or an alloy of AgGe, CuZn, CuSn, CuAg, or CuAgSn, whereby the alloy layers have a higher corrosion resistance than the pure metal layers. The term "metal layers" thus includes alloys.

To protect the metal layer from oxidation, in a preferred embodiment of the process of the invention, a protective layer is applied to the metal layer after step c), whereby a protective layer made from a cross-linked polyurethane is especially preferred.

Furthermore, the underlying object of the invention is satisfied by a water-vapor-permeable, watertight, heat-reflecting flat composite comprising a metal layer and a nonporous, water-vapor-permeable, watertight, hydrophilic flat substrate and producible according to the previously described process of the invention.

Furthermore, the underlying object of the invention is satisfied by a water-vapor-permneable, watertight, heat-reflecting flat composite comprising a metal layer and a nonporous, water-vapor-permeable, watertight, hydrophilic flat substrate, whereby the metal layer has a surface facing the substrate and a surface facing away from the substrate, the substrate has a surface facing the metal layer and a surface facing away from the metal layer, and the metal layer adheres at least predominantly to the substrate surface such that it passes the Tesa tape test.

In the context of the present invention, the property that the metal layer at least predominantly adheres to the substrate surface such that it passes the Tesa tape test means that adhesion of the metal layer passes the Tesa tape test over nearly the entire substrate surface facing the metal layer. In this context, passing the Tesa tape test means that, when attempting to remove a strip of "Tesa" tape applied to the metallized side of the composite, either the substrate is lacerated or the "Tesa" tape can be removed without destroying the substrate and without transferring metal with it.

In a preferred embodiment of the composite of the invention, adhesion of the metal layer passes the Tesa tape test over the entire substrate surface.

In a further preferred embodiment of the composite of the invention, the substrate is joined to a textile fabric, such as a woven, nonwoven, or knitted fabric, on the substrate surface facing away from the metal layer.

The underlying object of the invention is also satisfied by a water-vapor-permeable, watertight, heat-reflecting flat composite comprising a metal layer and a nonporous, water-vapor-permeable, watertight, hydrophilic flat substrate, whereby the metal layer has a surface facing the substrate and a surface facing away from the substrate, the substrate has a surface facing the metal layer and a surface facing away from the metal layer, the substrate is joined on the surface facing the metal layer to a textile fabric whose filaments are spaced apart, and adhesion of the metal layer passes the tape test both on the filaments and between the filaments on the substrate surface.

In this context, passing the tape test means that, when attempting to remove a strip of "Tesa" tape applied to the metallized side of the composite, the "Tesa" tape can be removed without destroying the substrate and without transferring metal with it.

In a preferred embodiment of the composite of the invention, the substrate consists of a polyether ester, polyether amide, or polyether urethane film.

Preferably, the metal layer of the composite of the invention is Al, Cu, Au, or Ag or an alloy of AgGe, CuZn, CuSn, CuAg, or CuAgSn.

The metal layer of the composite of the invention preferably has a thickness from about 10 nm to about 200 nm, especially preferably from about 30 nm to about 180 nm, since in these ranges the composites of the invention are highly water-vapor-permeable and heat reflecting.

In a preferred embodiment of the composite of the invention, the metal layer is provided with a protective layer on its surface facing away from the substrate, whereby the protective layer is especially preferred to be a cross-linked polyurethane.

The composite of the invention is advantageously suited for manufacturing clothing that is not only watertight and water-vapor-permeable but also offers the wearer all the protective functions that the metal layer makes possible, such as protection from heat loss and IR-based detection, protection from heat, UV radiation, and electro-smog, and protection from static electricity. In addition, the metal layer improves the aesthetic appearance for applications in which a metallic look is desirable, and it enables temperature compensation over the composite surface due to the thermal conductivity of metal.

An embodiment of the invention which yields an especially high value of thermal insulation and which, therefore, is preferred, is constituted by a composite producible using a process of the invention or by a composite according to the invention as described before, which is characterized in that on the surface of the metal layer facing away from the substrate or on the protective layer, a textile fabric is placed. The textile fabric exhibits a surface facing the metal layer or the protective layer and a surface facing away from the metal layer or from the protective layer. Optionally on the textile fabric, on it's surface facing away from the metal layer or from the protective layer, a second textile material is placed. The optional second textile material may be made of a material that is convection suppressing.

The textile fabric is selected from such materials which suppress convection and which are formed in such a way that the surface of the textile fabric facing the metal layer or the protective layer contacts only a part of the surface of the metal layer or of the protective layer. In a preferred embodiment of the invention, the textile fabrics that suppress convection and which are formed in such a way that the surface of the textile fabric facing the metal layer or the protective layer contacts only a part of the surface of the metal layer or of the protective layer can be knitted fabrics having an area density of about 30 g/m² and a thickness of about 250 µm. The knitted fabrics preferably contact about 20% of the surface of the metal or the protective layer.

The invention will be explained in more detail in the following example, but the present invention is not limited to this example.

EXAMPLE

In a receiver with a volume of 40 liters, a 10 µm thick polyether ester film, commercially available under the name SYMPATEX®, is affixed with adhesive tape in a specimen holder that is positioned 20 cm above a tungsten helix with a charge of aluminum. The area of the film is 15×17 cm. The receiver is evacuated to 0.00003 mbar. For pre-cleaning, a plasma treatment is then conducted with air as the reactive gas. For this purpose, air is fed into the receiver at a pressure of 0.02 mbar, and a plasma is ignited. The plasma has a frequency of 50 Hz and a power of about 30 W. The plasma is left to act on the film for 60 seconds. To metallize the pre-cleaned film, the receiver is subsequently evacuated to 0.00003 mbar and the aluminum charge on the tungsten helix is vaporized by electrically heating the helix, forming an Al layer on the polyether ester film. The thickness of the Al layer depends on the duration of Al vapor deposition.

The thickness of the Al layer is determined using ICP-MS (inductive coupled plasma—mass spectroscopy). The aluminum in this case is dissolved in hydrochloric acid within a defined area of the metallized film. The solution is metered as an aerosol, with argon as a carrier gas, into a plasma torch, resulting in ion generation in the plasma gas. An aliquot portion of the plasma gas is passed to a mass spectrometer. In the mass spectrometer, the ions in the plasma gas are separated according to mass and charge and quantified in a downstream detector. The thickness of the metal layer is determined by comparing with control standards. Composites were produced with an aluminum thickness of 15±4 nm, 60±4 nm, and 150±13 nm (see Table). This was accomplished by subjecting the SYMPATEX® films to Al vapor deposition for about 8, 30, and 75 seconds.

To determine the adhesion between the metal layer and the film in the three composites, the tape test was conducted. A strip of "Tesa" tape was applied to the metal layer. An attempt to remove the "Tesa" tape from the film resulted in no metal being transferred.

For further determination of the adhesion between the metal layer and the film in the three composites, the composites were stored for 45 minutes in water with a temperature of 50° C. After the composites were removed from the water, a cloth was used to rub the metallized side of the composites under slight pressure. Fault-free adhesion of the aluminum layer to the film was observed. Thereafter, the metallized side of the composite was dried and a "Tesa" tape strip applied to the metallized side. An attempt to remove the "Tesa" tape from the film resulted in no metal being transferred.

The aluminum thickness ($d_{A1}$), water-vapor permeability (WVP), measured according to ASTM E 96-66, method B with the modification $T_{water}$=30° C., $T_{air}$=20° C., relative humidity=60%, and air flow of 2 m/s, and the IR reflection ($R_{IR}$), measured in the wavelength range from 2.5 to 10 µm, of the metallized SYMPATEX® films A, B, and C are indicated in the following table, whereby the range of error given for the thickness is the maximum error resulting from two measurements.

TABLE

| Specimen | $d_{A1}$ (nm) | WVP (g/m² · 24 h) | $R_{IR}$ (%) |
|---|---|---|---|
| SYMPATEX ® film | 0 | 3000 | 10 |
| Metallized SYMPATEX ® film A | 15 ± 4 | 2700 | 86 |
| Metallized SYMPATEX ® film B | 60 ± 4 | 2600 | 97.5 |
| Metallized SYMPATEX ® film C | 150 ± 13 | 2200 | 100 |

The table shows that the metallized SYMPATEX® film C at 100% IR reflection nevertheless has a residual water-vapor permeability of 2200 g/m²·24 h, which is reduced by only about one-fourth compared to the water-vapor permeability of the SYMPATEX® film of 3000 g/m²·24 h.

What is claimed is:

1. A water-vapor-permeable, watertight, heat-reflecting flat composite comprising a continuous metal layer and a non-porous, water-vapor-permeable, watertight, hydrophilic flat substrate, wherein the metal layer has a surface facing the substrate and a surface facing away from the substrate, the substrate has a surface facing the metal layer and a surface facing away from the metal layer, and wherein the substrate is joined on the surface facing the metal layer to a textile fabric whose filaments are spaced apart, and the metal layer adheres both on the filaments and between the filaments of the textile fabric on the substrate surface.

2. The composite according to claim 1, wherein the substrate is comprised of a polyether ester, polyether amide, or polyether urethane film.

3. The composite according to claim 1, wherein the metal layer is comprised of Al, Cu, Au, or Ag or an alloy of AgGe, CuZn, CuSn, CuAg, or CuAgSn.

4. The composite according to claim 1, wherein the metal layer has a thickness of about 10 nm to about 200 nm.

5. The composite according to claim 1, wherein the metal layer has a thickness of about 30 nm to about 180 nm.

6. The composite according to claim 1, wherein the composite is in a form of clothing.

7. The composite according to claim 1, wherein an adhesion of the metal layer passes a tape test both on the filaments and between the filaments of the textile fabric on the substrate surface.

8. The composite according to claim 1, wherein the composite further comprises a protective layer on the surface of the metal layer facing away from the substrate.

9. The composite according to claim 8, wherein the protective layer is a cross-linked polyurethane.

10. The composite according to claim 8, wherein the composite further comprises a second textile fabric on a surface of the protective layer away from the substrate, which second textile fabric has a surface facing the protective layer and a surface facing away from the protective layer, and optionally a third textile fabric on the surface of the second textile fabric facing away from the protective layer, wherein the second textile fabric is comprised of materials which suppress convection and wherein the surface of the second textile fabric facing the protective layer contacts only a part of the surface of the protective layer.

11. The composite according to claim 10, wherein the second textile fabric comprises a knitted fabric having an area density of 30 g/m² and a thickness of 250 µm.

12. The composite according to claim 10, wherein the second textile fabric comprises a knitted fabric contacting about 20% of the surface of the metal layer or the protective layer.

13. The composite according to claim 1, wherein the composite further comprises a second textile fabric on the surface of the metal layer facing away from the substrate, which second textile fabric has a surface facing the metal layer and a surface facing away from the metal layer, and optionally a third textile fabric on the surface of the second textile fabric facing away from the metal layer, wherein the second textile fabric is comprised of materials which suppress convection and wherein the surface of the second textile fabric facing the metal layer contacts only a part of the surface of the metal layer.

14. The composite according to claim 13, wherein the second textile fabric comprises a knitted fabric having an area density of 30 g/m$^2$ and a thickness of 250 μm.

15. The composite according to claim 13, wherein the second textile fabric comprises a knitted fabric contacting about 20% of the surface of the metal layer or the protective layer.

\* \* \* \* \*